United States Patent [19]
Horiuchi et al.

[11] Patent Number: 5,733,640
[45] Date of Patent: Mar. 31, 1998

[54] FIRED BODY FOR MANUFACTURING A SUBSTRATE

[75] Inventors: Michio Horiuchi; Yukiharu Takeuchi; Yoichi Harayama, all of Nagano, Japan

[73] Assignee: Shinko Electric Industries, Co., Ltd., Nagano, Japan

[21] Appl. No.: 493,616

[22] Filed: Jun. 22, 1995

[30] Foreign Application Priority Data

| Jul. 4, 1994 | [JP] | Japan | 6-152366 |
| Feb. 22, 1995 | [JP] | Japan | 7-033499 |

[51] Int. Cl.$^6$ ............... B32B 3/00; H01R 43/02
[52] U.S. Cl. ............ 428/210; 29/878; 264/108; 439/66; 439/68; 439/91; 428/432
[58] Field of Search .............. 264/108; 439/68, 439/66, 91; 29/878, 884; 428/210, 320.2, 432, 433

[56] References Cited

U.S. PATENT DOCUMENTS

| 2,189,340 | 2/1940 | Donal, Jr. . | |
| 3,772,774 | 11/1973 | Knippenberg | 29/878 |
| 4,209,481 | 6/1980 | Kashiro et al. | 439/91 X |
| 4,511,663 | 4/1985 | Taylor | 428/432 X |
| 4,927,368 | 5/1990 | Shino | 439/66 |
| 4,952,538 | 8/1990 | Kumagai et al. | 428/432 X |
| 5,033,675 | 7/1991 | Shino | 439/66 |
| 5,196,212 | 3/1993 | Knoblach | 264/108 X |
| 5,240,671 | 8/1993 | Carey | 419/9 |
| 5,331,514 | 7/1994 | Kuroda | 439/91 X |
| 5,364,276 | 11/1994 | Inasaka | 29/878 X |

FOREIGN PATENT DOCUMENTS

| 12 27 965 | 11/1966 | Germany . |
| 33 40 926 | 7/1984 | Germany . |
| 60-009146 | 1/1985 | Japan . |
| 2-267989 | 11/1990 | Japan . |
| 4-179194 | 6/1992 | Japan . |

OTHER PUBLICATIONS

*Patent Abstracts of Japan*, vol. 11, No. 367 (E–561), Nov. 28, 1987 & JP–A–62 139345 (Matsushita), Jun. 23, 1987.

*Patent Abstracts of Japan*, vol. 15, No. 22 (E–1024), Jan. 18, 1991 & JP–A–02 267989 (NGK), Nov. 1, 1990.

*Patent Abstracts of Japan*, vol. 15, No. 273 (E–1088), Jul. 11, 1991 & JP–A–03 093290 (Fujitsu), Apr. 18, 1991.

*Primary Examiner*—Carl J. Arbes
*Attorney, Agent, or Firm*—Staas & Halsey

[57] ABSTRACT

A fired body for manufacturing a substrate is pillar-shaped and includes metallic wires arranged inside the fired body in parallel with its axis. The melting point of the metallic wires is higher than the melting point, pour point or softening point of an insulating base body of the fired body. A method of manufacturing a substrate includes the steps or: forming a pillar-shaped unfired body in which metallic wire rods having a melting point higher than the firing temperature of a fired body are embedded inside and in parallel with the axis; firing the unfired body at a temperature higher than the melting point of the fired body; and cutting the fired body in a direction perpendicular to the axis and to a predetermined thickness.

10 Claims, 2 Drawing Sheets

FIRED BODY FOR MANUFACTURING A SUBSTRATE

BACKGROUND OF THE INVENTION

1. Field of the Invention

The present invention relates to a substrate on which thin film wiring or the like is provided. The present invention also relates to a fired or burned body for manufacturing such a substrate and a method for manufacturing the substrate.

2. Description of the Related Art

In accordance with the recent development of highly integrated electronic devices, there is a demand for fine and very dense wiring on a substrate. In order to meet the demand, a method in which the fine wiring is provided on a ceramic substrate using a thin film is widely employed. Moreover, when a via is formed penetrating the ceramic substrate, both sides of the substrate can be effectively used, so that an even more dense wiring can be realized. For this reason, this method is most widely used, and this type of substrate is put into practical use for assembling semiconductor packages.

When the wiring becomes finer, blow holes in the ceramics, opening onto the substrate surface, might be a cause of disconnection or high resistance. When the position of a via is slightly displaced, it could be a cause of defective electric continuity. Therefore, in order to form a fine and highly dense wiring using a thin film, it is necessary that the ceramic substrate is denser and the number of blow holes is smaller and further the surface is flat. In addition to that, the positional accuracy of the via must be high. Further, there is a strong requirement for a reduction of the cost.

Conventionally, the following method is employed to manufacture a ceramic substrate having the via described above. First, a ceramic green sheet is provided. After the ceramic green sheet has been subjected to punching so as to form a predetermined shape, through-holes are formed at predetermined positions. Next, the through-holes are filled with metallic paste. At least two layers of green sheets that have been processed in this way are laminated. The thus obtained lamination body is subjected to binder-removal treatment and then fired. In this way, the substrate is formed. In this case, a substrate that has warped badly is corrected or subjected to selection. Then the substrate is cut into a predetermined shape and polished, and manufacture of the substrate is completed.

In the above-mentioned conventional manufacturing process, when the thickness of the substrate is small, it is possible to fill the through-holes with metallic paste after the green sheets have been made into a laminated body. However, in many cases, it is necessary to fill the through-holes with metallic paste for each green sheet. The number of substrates obtained from one sheet of green sheet laminated body is approximately 1 to 4. When the size of the green sheet lamination body is increased so as to increase the number of substrates obtained from one sheet of green sheet lamination body, not only the working efficiency is lowered but also the positional accuracy of the via is deteriorated. After all, the number of units handled in each process is approximately the same from the first to the final stage. Accordingly, the number of the obtained substrates per one process or one device is small. Therefore, a sufficiently high mass production effect can not be provided, and it is impossible to reduce the cost. Further, due to electric continuities caused by displacement of the via in the process of lamination and also due to the warping of the substrate, it is difficult to reduce the cost.

SUMMARY OF THE INVENTION

An object of the present invention is to provide a fired body for manufacturing a substrate, by which a via can be formed with high positional accuracy and the mass production of substrates can be accomplished.

Another object of the present invention is to provide a substrate from such a fired body and a method for manufacturing such a substrate.

According to the present invention, there is provided a pillar-shaped fired body for manufacturing substrates, said fired body comprising: a pillar-shaped insulating base body having an axis; and one or more metallic wiring, arranged inside the insulating base body in parallel to the axis, wherein the melting point of the metallic wiring is higher than the melting point, pour point or softening point of the insulating base body.

It is preferable that the pillar-shaped fired body further comprises a pillar-shaped insert body arranged inside the insulating base body parallel to the axis thereof, together with the metallic wirings, wherein the melting point of the pillar-shaped insert body is higher than the melting point, pour point or softening point of the insulating base body. In this case, the pillar-shaped insert body may be made of metal. The metallic pillar may be made of copper, nickel, iron, tungsten or molybdenum, or alternatively the metallic pillar may be made of metal, the principal component of which is at least one of copper, nickel, tungsten and molybdenum.

It is preferable that the pillar-shaped insulating base body is made of ceramic or silicon.

It is also preferable that the pillar-shaped fired body further comprises a hollow tube body arranged inside the insulating base body in parallel to the axis thereof, together with the metallic wiring, wherein the melting point of the hollow tube body is higher than the melting point, pour point or softening point of the insulating base body.

The insulating base body may have a through hole extending parallel to the axis thereof.

The metallic wiring may be made of copper, nickel, iron, silver or gold, or alternatively the metallic wiring may be made of metal, the principal component of which is at least one of copper, nickel, iron, silver and gold.

The cross-sectional shape of the pillar-shaped fired body may be a circle or square.

It is preferable that a principal component of the pillar-shaped insulating base body is crystallized glass or amorphous glass.

According to another aspect of the present invention, there is provided a substrate formed into a sheet-shape, onto the surface of which the metallic wiring is exposed when the fired body for manufacturing the substrate described in above is cut in a direction perpendicular to the axis and to a predetermined thickness.

According to still another aspect of the present invention, there is provided a method of manufacturing a substrate comprising the steps of: forming a pillar-shaped unfired body comprising a pillar-shaped insulating base body having an axis, arranging metallic wiring inside the insulating base body in parallel to the axis, wherein the melting point of the metallic wiring is higher than the melting point, pour point or softening point of the insulating base body; firing the unfired body at a temperature higher than the melting point, pour point or softening point of the insulating base to obtain a pillar-shaped fired body; and cutting the fired body in a direction perpendicular to the axis, and to a predetermined thickness, to obtain a plurality of substrates.

In this case, the pillar-shaped unfired body may comprise: a pillar-shaped insulating base body having its axis, metallic wiring arranged inside the insulating base body parallel to the axis, and a pillar-shaped insert body arranged inside the insulating base body parallel to the axis thereof, together with the metallic wiring, wherein the melting point of the pillar-shaped insert body is higher than the melting point, pour point or softening point of the insulating base body.

In this case, the pillar-shaped insert body is a metallic pillar made of copper, nickel, iron, tungsten or molybdenum, or alternatively the metallic pillar is made of metal, the principal component of which is at least one of copper, nickel, tungsten and molybdenum.

The pillar-shaped insert body may be made of ceramic or silicon.

It is preferable that the pillar-shaped unfired body comprises: a pillar-shaped insulating base body having an axis, metallic wiring arranged inside the insulating base body in parallel to the axis, and a hollow tube body arranged inside the insulating base body in parallel to the axis thereof, together with the metallic wirings, wherein the melting point of the hollow tube body is higher than the melting point, pour point or softening point of the insulating base body.

It is also preferable that the pillar-shaped unfired body further comprises: a pillar-shaped insert body arranged inside the insulating base body parallel to the axis thereof, together with the metallic wiring, wherein the melting point of the pillar-shaped body is higher than the melting point, pour point or softening point of the insulating base body; and said method further comprises: a step of removing the pillar-shaped insert body from the fired body to obtain a pillar-shaped fired body having a through hole arranged in parallel to the axis thereof.

It is further preferable that the pillar-shaped unfired body is formed in a container and fired together with the container.

In this case, the container is made of copper, nickel or iron, or alternatively the container is made of metal, the principal component of which is at least one of copper, nickel and iron, or alternatively the container is made of a ceramic such as alumina, mullite and boron nitride, or made of graphite.

According to the present invention, a substrate is provided by an entirely different manufacturing process from that of the conventional method. When the fired body for manufacturing the substrate is used, the substrate having vias is provided without causing various conventional defects which exert an influence on the yield. Further, it is possible to mass produce the substrates and reduce the cost greatly.

That is, in the present invention, first, the pillar-shaped fired body is obtained which has metallic wiring parallel with the axis. Next, a substrate having vias is obtained when the pillar-shaped body is cut in a direction perpendicular to the axis. In order to obtain the above pillar-shaped fired body, it is necessary to form a pillar-shaped unfired body. In this case, a slip cast forming method or an extrusion forming method may be applied. However, according to the conventional method, it is difficult to form metallic wiring in parallel with the axis. At least after the unfired body has been formed or after the formed body has been fired, it is difficult to provide the metallic wire in the body from the following reasons. According to the conventional method, after through-holes have been formed in the unfired body, metallic paste is charged into the through-holes and fired. First, it is difficult to form long through-holes in the pillar-shaped unfired body. Even if the through-holes are formed in the pillar-shaped unfired body, it is difficult to charge metallic paste into the through-holes with a sufficiently high density. The circumstances are the same in the case of the fired body.

In the present invention, in order to solve the above problems, metallic wire rods are used. They are made to penetrate the unfired body simultaneously when the unfired body is formed, so that they are used as the metallic wiring. Then the thus provided unfired body is fired. In this way, the fired body for manufacturing a substrate is obtained.

The unfired body is made of material, the melting point, pour point or softening point of which is lower than the melting point of the metallic wire rods. Consequently, according to the present invention, in the process of firing, the insulating base body of the unfired body is fluidized. Therefore, it is necessary that the unfired body is fired in a container, the inner structure of which is the same as the shape of the fired body. Usually, in the process of firing, it is possible to use the container that has been used when the unfired body is formed. Therefore, it is not necessary to add a binder and plasticizer to the unfired body when it is formed. For this reason, the unfired body of the present invention is dried more easily than the conventional one, and further the binder-removal process is not necessary.

As long as the insulating base body of the pillar-shaped fired body is sufficiently fluidized at the firing temperature, any composition may be adopted, however, it is preferable to use a composition, the principle component of which is crystal glass or an amorphous glass. Various types of ceramic powder, such as alumina ceramic and mullite ceramic, are added to an amount not exceeding the limit at which the fluidization of the composition can be ensured at the firing temperature. Depending on the composition, the maximum firing temperature is set in a range from 500° C. to 1400° C. At the above maximum temperature, the aforementioned pillar-shaped fired body can be provided.

At least one of copper, nickel, iron, aluminum, silver or gold is used as the principle component of the metallic wire rods.

In this connection, in the process of firing, the insulating base body through which the metallic wire rods penetrate shrinks in accordance with an increase in the density. On the other hand, the metallic wire rods expand. However, since the insulating base body of the unfired body is fluidized at a certain temperature, stress caused by the above volume change is released. In the cooling process after firing, the difference of the thermal expansion coefficient between the metallic wire rods and the insulating base body could be a cause of generation of stress. However, when the diameter of the metallic wire rod is sufficiently small and the Young's modulus is sufficiently low, no problems are caused. Depending on the height of the pillar-shaped fired body, when the difference is approximately $12 \times 10^{-6}$/°C., a problematic stress is not caused, so that the occurrence of cracks and electric disconnection can be avoided.

First, when a difference of the thermal expansion coefficient between the unfired body and the container used for firing is large, a problematic stress is generated. Secondly, when a metallic insert pillar for heat radiation penetrates the unfired body differently from the metallic wire rods, and also when a difference of the thermal expansion coefficient between the two is large, a problematic stress is generated.

In the process of firing, a metallic container can be used, the principle component of which is at least one of copper, nickel and iron. Also, a ceramic container can be used, the principle component of which is at least one of alumina, mullite and boron nitride. Also, a container made of graphite can be used. In order to prevent the adhesion of the fired body and the container after firing, for example, a container made of hexagonal boron nitride or graphite can be used. Due to the foregoing, the fired body is apt to separate from the container in the process of cooling after the completion of firing. In this case, no problems are caused in the stress. In the case where a metallic container is used, it is possible to prevent a damage of the fired body by making the wall thickness of the container as small as possible. This effect can be provided when a container made of copper is used. Even when the wall thickness of a container made of another metal is large, depending on the composition of the unfired body, no cracks are caused on the main surface of the pillar-shaped fired body, but open cracks are caused only in restricted portions such as a bottom portion and a periphery of the fired body. No problems are caused by these restricted open cracks in the later process. On the other hand, when a container made of alumina ceramic or mullite ceramic is used, it is necessary to adjust the difference in the thermal expansion coefficients of the unfired body and the container to approximately $3 \times 10^{-6}/°C$.

When a substrate having a radiating section is manufactured, the structure in which a metallic pillar penetrates through the unfired body is used. Even in this case, no problems are caused due to stress until the insulating base portion of the unfired body is solidified in the cooling process after firing. After that, a problem is caused due to the difference of the thermal expansion coefficient in the cooling process. The principle component of the metal composing the metallic pillar is at least one of copper, nickel, iron, tungsten or molybdenum. In this connection, when consideration is given to the thermal expansion coefficient of the insulating base body, the height of the pillar-shaped fired body and the sectional area of the metallic pillar, the thermal stress is preferably minimized by using a compound metal of copper and tungsten.

When this pillar-shaped fired body is cut by a predetermine thickness in a direction perpendicular to the axis, a substrate having vias is obtained. That is, when the metallic wiring in the fired body is cut, the vias are formed. According to the type of the process to be effected later, when necessary, the outer periphery is subjected to grinding before the fired body is cut, and further the orientation, flat processing is effected. After the fired body has been cut, usually, both sides of the substrate are subjected to polishing.

As described above, a large number of substrates can be provided from one fired body. For example, not less than 180 sheets of substrates of 0.6 to 0.7 mm thickness having the via and radiating section, can be provided by a pillar-shaped fired body of 20 cm height. In this case, each substrate is obtained by the process of cutting. Therefore, each substrate is not warped unlike a substrate individually fired. Accordingly, almost all substrates can be transferred to the process of polishing both sides immediately after the process of cutting. In this case, the via conductors are not made by a method in which the green sheets are laminated and connected. Accordingly, there are no problems of electric disconnection and high resistance caused by the displacement of lamination.

When the unfired body is formed into a columnar-shape, shrinkage becomes uniform in the process of firing, so that the size (diameter) of the substrate that has been cut off can be kept constant. When the unfired body is formed into a square-pillar shape, it is possible to increase the area of the substrate which can be utilized effectively. Also, the substrate that has been cut from the unfired body may be divided into several pieces on the same plane, and each piece of the divided substrate may be used as an individual substrate.

When the substrate obtained according to the present invention is put on a ceramic substrate, on the surface of which a wiring pattern is provided, and also when the substrate is put on a glass substrate, a package (compound package) may be provided. In order to form this package into a product having a cavity for accommodating a semiconductor element, the process may be effected in the following manner. A tube or cylindrical body, the section of which is circular or rectangular, is vertically provided in a container into which material of the unfired body is poured. After metallic wire rods have been arranged in parallel with the axis of the container, material of the unfired body is poured into the container so that the material cannot enter the tube body. After that, the material of the unfired body is fired together with the entire container. The substrate is obtained when the fired body is sliced, and a portion in which the cylindrical body is arranged is formed into a through-hole. The edge portion of the through-hole is made of the sliced portion of the tube body.

The tube body is made of metal such as copper and nickel or alloy containing these metals, for example, iron-cobalt-nickel alloy and 42 alloy. Also, the tube body is made of ceramic such as alumina, mullite and aluminum nitride.

In order to obtain a substrate having a simple through-hole, a pillar-shaped body made of graphite or hexagonal boron nitride is provided instead of the tube body made of metal or ceramics, and material of the unfired body is poured and fired in the container. After that, the pillar-shaped body is removed. In this way, a substrate having the through-hole is obtained.

In this case, when the thermal expansion coefficient of the unfired body material is a little lower than that of the pillar-shaped body, a small gap is generated on an interface between the fired body and the pillar-shaped body. Accordingly, the pillar-shaped body can be easily pulled out from the fired body.

As described above, when the pillar-shaped body provided in the container is not removed but left as it is in the same manner as that of a case in which the metallic pillar is used, a substrate of a compound composition can be obtained. When a ceramic pillar or silicon pillar is used for the pillar-shaped body, a difference of the physical property between the pillar and the matrix portion of the substrate is small, which is advantageous, because the substrate can be easily sliced and effectively polished. Further, the compound substrate of ceramics or silicon is advantageous in that the radiating property is excellent and the thermal stress resistance is high.

DESCRIPTION OF THE PREFERRED EMBODIMENTS

EMBODIMENT 1

Figure 1:
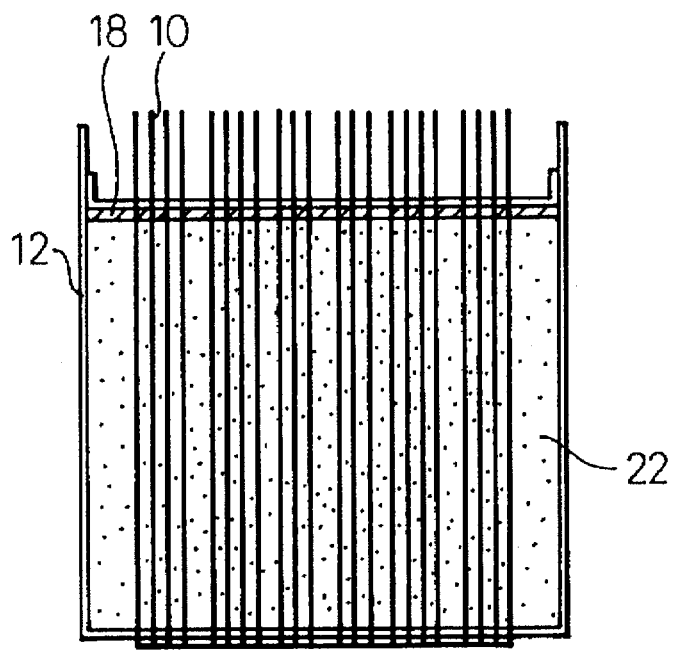
FIG. 1 is a schematic illustration for explaining the circumstances of forming an unfired body.
Figure 2:
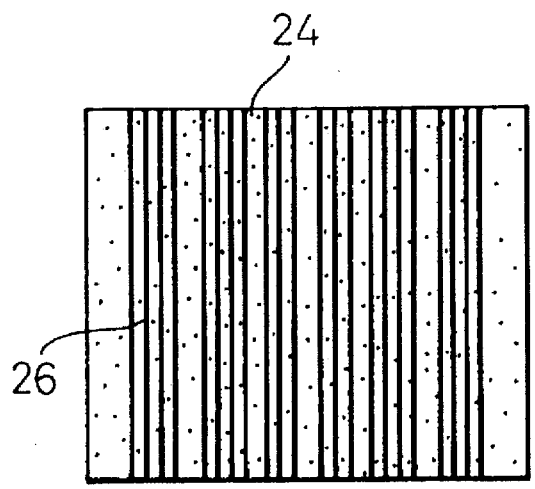
FIG. 2 is a schematic illustration for explaining a fired body.
Figure 3:
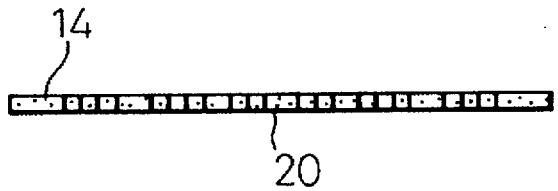
FIG. 3 is a schematic illustration for explaining a substrate that has been cut off.

A powder of borosilicate glass, the average particle size of which was approximately 16 μm, the thermal expansion coefficient of which was approximately $4.5 \times 10^{-6}/°C$., and the softening point of which was approximately 640° C., was dispersed in ethanol so as to prepare a suspension of high concentration. The thus prepared suspension was filled into a container 12 made of steel, the diameter of which was approximately 14 cm, wherein a plurality of metallic wire rods 10 composed of copper wires, the diameter of which was approximately 0.24 mm, penetrated the container 12. In the container 12, the suspension of high concentration was subjected to sedimentation and dried. In this way, an unfired body 22 was obtained (shown in FIG. 1). The unfired body 22 was fired together with the container 12 at the maximum temperature of 700° C. for one hour in the atmosphere of dry $N_2$. Then the container 12 was cut and a fired body 24 was taken out. Although a large number of cracks were generated on the outer circumference of the fired body 24, all of them existed locally only on the outer circumference, and none of them reached the inside of the fired body 24. After the outer circumference of the fired body 24 had been subjected to grinding. The fired body 24 was cut perpendicular to the metallic wirings 26, with a slicer having an inner circumferential blade, to obtain a plurality of substrates 14 (shown in FIG. 3), each of which having a thickness of approximately 0.7 mm. It was confirmed that there were no big blow holes inside and no cracks. Especially, it was confirmed that there were no cracks in the periphery of the vias 20.

Numeral 18 is a cover member having through-holes through which the metallic wire rods 10 penetrate at a predetermined pattern. The bottom wall of the container 12 has also through-holes through which the metallic wire rods 10 penetrate. In this connection, nickel, iron, silver and gold may be used as the metallic wire rods.

EMBODIMENT 2

Powder of CaO—BaO—$SiO_2$ glass, the average particle size of which was approximately 15 μm, the thermal expansion coefficient of which was approximately $6.5 \times 10^{-6}/°C$., and the softening point of which was approximately 850° C., was dispersed in ethanol so as to prepare a suspension of high concentration. The thus prepared suspension was filled into a cylindrical container made of alumina ceramics, the diameter of which was approximately 9 cm, wherein metallic wire rods composed of copper wires, the diameter of which was approximately 0.24 mm, penetrated the container. In the cylindrical container, the suspension of high concentration was subjected to sedimentation and dried. In this way, an unfired body was obtained. The unfired body was fired together with the alumina ceramic container at the maximum temperature of 1020° C. for one hour in the atmosphere of dry $N_2$. In this way, a fired body was obtained. There were no cracks on the alumina ceramic container and the fired body. The fired body was cut perpendicular to the metallic wiring, together with the alumina ceramic container, using a slicer having an inner circumferential blade, to obtain a plurality of substrates, each of which having a thickness of approximately 0.7 mm. It was confirmed that there were no big blow holes inside and no cracks. Especially, it was confirmed that there were no cracks in the periphery of the via. In this connection, nickel, iron and gold may be used as the metallic wire rods.

EMBODIMENT 3

Figure 4:
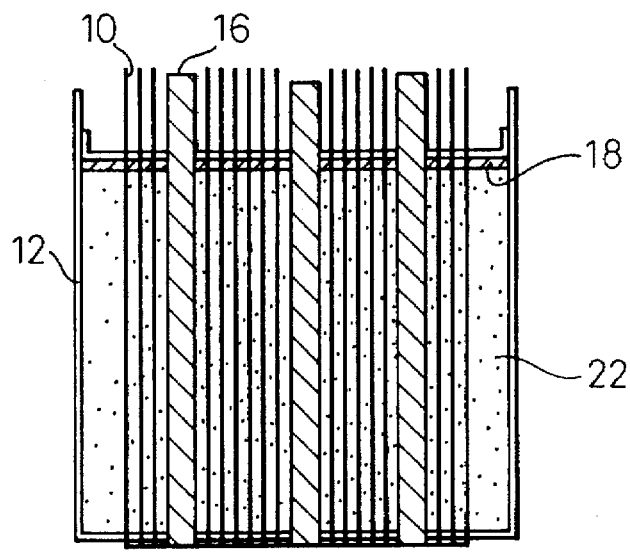
FIG. 4 is a schematic illustration for explaining another embodiment.
Figure 5:
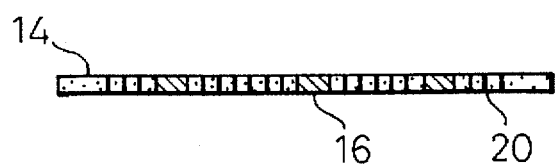
FIG. 5 is a schematic illustration for explaining the substrate that has been cut off in the embodiment shown in FIG. 4.

The container 12, the diameter of which was 14 cm, was made of steel and was filled with glass powder suspension which was the same as that of Embodiment 2. A plurality of metallic wire rods 10 composed of copper and 0.24 mm diameter and metallic pillars 16 made of a copper-tungsten compound metal (copper 20%), the diameter of which was approximately 10 mm, penetrated the container 12. In the container, the suspension was subjected to sedimentation and dried. In this way, the unfired body 22 was obtained (shown in FIG. 4). The unfired body 22 was fired in the same manner as that of Embodiment 2. The fired body 22 was cut into a plurality of substrates 14 (shown in FIG. 5), the thickness of which was approximately 1.0 mm. It was confirmed that there were no defects such as cracks inside the fired body.

EMBODIMENT 4

10 volume % of alumina powder, the average particle size was approximately 0.6 μm, was mixed with the same glass powder as that of Embodiment 2 so as to prepare a uniform suspension. This suspension was placed in a cylindrical container made of boron nitride ceramic, the inner diameter of which was approximately 10 cm and through which metallic wire rods, composed of copper wires the diameter of which was approximately 0.24 mm penetrated. The suspension was subjected to sedimentation and dried. In this way, the unfired body was made. The unfired body was fired at the maximum temperature of 980° C. for 2 hours in the atmosphere of dry $N_2$ in the boron nitride container. After the obtained fired body had been taken out from the boron nitride container, it was cut in the same manner as that of Embodiment 2 so that the substrates were obtained. It was confirmed that there were no big blow holes or cracks. When alumina powder is added in this way, it is possible to enhance the mechanical strength of the substrate.

EMBODIMENT 5

Figure 6:
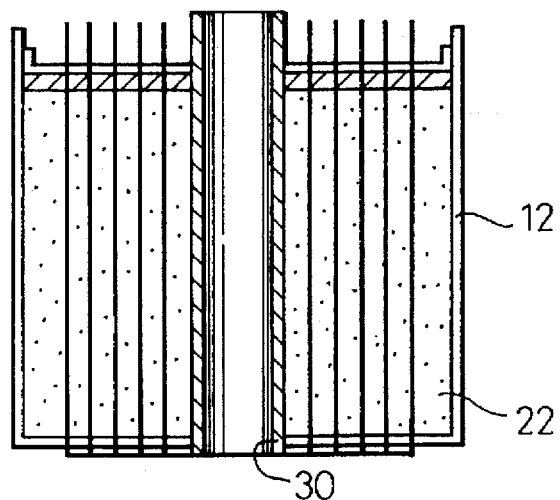
FIG. 6 is a schematic illustration for explaining the circumstances in which an unfired body is formed.
Figure 7:
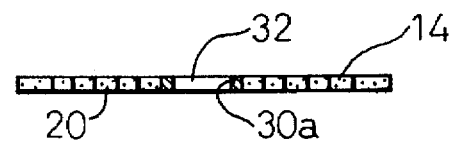
FIG. 7 is a schematic illustration for explaining the substrate that has been cut off in the embodiment shown in FIG. 6.

A powder of CaO—BaO—$SiO_2$ glass, the average particle size of which was approximately 15 μm, the thermal expansion coefficient of which was approximately $6.6 \times 10^6/°C$., and the softening point of which was approximately 850° C., was dispersed in ethanol so as to prepare a suspension of high concentration. The thus prepared suspension was placed in a cylindrical container 12 made of alumina ceramics, the inner diameter of which was approximately 10 cm, wherein metallic wire rods 10 composed of copper wires, the diameter of which was approximately 0.3 mm, and an alumina ceramic square-shaped tube body 30, the wall thickness of which was approximately 0.8 mm and the length of the side of which was approximately 17 mm, were vertically provided in the cylindrical container 12. The suspension was subjected to sedimentation and dried. In this way, an unfired body 22 was obtained (shown in FIG. 6). The unfired body 22 was fired together with the container 12 at the maximum temperature of 960° C. for 3 hours in the atmosphere of dry $N_2$. In this way, a fired body was obtained. The fired body was cut perpendicular to the metallic rods 10, together with the alumina ceramic container 12, using a slicer having an inner circumferential blade, to obtain a plurality of substrates 14, the thickness of which was approximately 0.5 mm. It was confirmed that there were no cracks (as shown in FIG. 7). The through-hole 32 on the substrate is held by a sliced piece 30a of the square-shaped tube body 30 made of alumina ceramics.

EMBODIMENT 6

Figure 8:
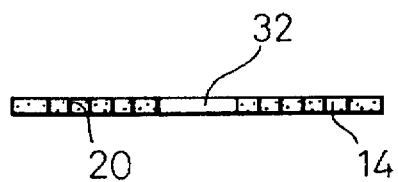
FIG. 8 is a schematic illustration for explaining the substrate that has been cut off in Embodiment 6.

A powder of borosilicate glass, the average particle size of which was approximately 16 μm, the thermal expansion coefficient of which was approximately 4.5×10$^{-6}$/°C., and the softening point of which was approximately 640° C., was used. Also, a square-shaped tube pillar made of graphite, the length of the side of which was approximately 17 mm, was used in this embodiment. Other points were the same as those of Embodiment 5. The thus obtained suspension of high concentration was placed in the cylindrical container made of alumina ceramics. In this way, an unfired body was made. Together with the container, the thus obtained unfired body was fired at the maximum temperature of 700° C. in the atmosphere of dry N$_2$ for 2 hours so as to obtain a fired body. The graphite pillar-shaped body was pulled out from the fired body and the fired body was sliced in the same manner as Embodiment 5, so that the substrates 14 each having a through-hole 32 was obtained (shown in FIG. 8). It was confirmed that there were no defects such as cracks inside the substrate 14.

EMBODIMENT 7

A square pillar made of 99% alumina ceramic, the length of the side of which was approximately 17 mm, was used for the pillar-shaped body, and a container made of boron nitride was used for the cylindrical container. Other points were the same as those of Embodiment 5, and the suspension of high concentration was placed in the cylindrical container made of alumina ceramics. The suspension of high concentration was subjected to sedimentation and dried. In this way, an unfired body was obtained. The unfired body was fired, together with the boron nitride container, at the maximum temperature of 960° C. for 3 hours in the atmosphere of dry N$_2$. In this way, a fired body was obtained. The fired body was cut perpendicular to the copper wires, together with the container, using a slicer having an inner circumferential blade, to obtain a plurality of substrates, the thickness of which was approximately 0.7 mm. It was confirmed that there were no big blow holes inside the substrate and no cracks. Especially, it was confirmed that there were no cracks in the peripheries of the copper via and the alumina ceramic portion.

EMBODIMENT 8

A square pillar made of 97% aluminium nitride ceramic, the length of the side of which was approximately 17 mm, was used for the pillar-shaped body, and a container made of boron nitride was used for the cylindrical container. Other points were the same as those of Embodiment 6. In this way, an unfired body was made. The unfired body was fired at the maximum temperature of 700° C. for 2 hours in an atmosphere of dry N$_2$. In this way, a fired body was obtained. In the same manner as that of Embodiment 6, a substrate was sliced from the fired body. It was confirmed that there were no cracks inside the obtained substrate.

EMBODIMENT 9

10 volume % of alumina powder, the average particle size of which was approximately 0.6 μm, was added to a powder of borosilicate glass, the maximum particle size of which was approximately 60 μm, the thermal expansion coefficient of which was approximately 2.6×10$^{-6}$/°C., and the softening point of which was approximately 830° C. Using the thus obtained mixed powder, a monocrystal pillar of silicon, having a square cross-section, the side of which was approximately 17 mm, and a cylindrical container made of graphite, the inner diameter of which was approximately 10 cm, an unfired body was obtained in the same manner as Embodiment 6. The thus obtained unfired body was fired at the maximum temperature of 980° C. in the atmosphere of dry N$_2$ for 3 hours. In this way, a fired body was obtained. The thus obtained fired body was sliced in the same manner as that of Embodiment 6 so as to obtain substrates. It was confirmed that there were no big blow holes or cracks on the substrate.

According to the present invention, it is possible to provide a substrate having a via of high positional accuracy or having a via and a metallic pillar for thermal radiation by a manufacturing process much simpler than that of the conventional method. Further, the number of substrates obtained in one process is large. Therefore, the production cost can be greatly reduced. According to the present invention, the via is not formed by laminating and connecting the green sheets, but the via is formed by cutting metallic wiring. Accordingly, no problems are caused with respect to the electric continuity because the displacement of lamination can be avoided, and further, the reproducibility of the shape and dimensional accuracy of the obtained substrate are high. According to the invention, the substrate is not fired for each one, but the entire body is fired and cut off to obtain each substrate. Accordingly, the substrate is not warped but the yield is high. It is possible to provide a substrate having a through-hole in which a semiconductor element can be mounted. Also, it is possible to provide a compound type substrate of ceramics or silicon which is excellent in radiating property and thermal stress property.

What is claimed:

1. A pillar-shaped fired body for manufacturing substrates, said fired body comprising:

a pillar-shaped insulating base body having an axis: and one or more metallic wires arranged inside the insulating base body in parallel with said axis;

wherein the melting point of said one or more metallic wirings is higher than the melting point, pour point or softening point of said insulating base body; and a pillar-shaped insert body arranged inside said insulating base body in parallel with said axis thereof, together with said one or more metallic wires, wherein the melting point of said pillar-shaped body is higher than the melting point, pour point or softening point of said insulating base body.

2. A pillar-shaped fired body as set forth in claim 1, wherein the pillar-shaped insert body is made of metal.

3. A pillar-shaped fired body as set forth in claim 2, wherein the metallic pillar is made of copper, nickel, iron, tungsten or molybdenum, or alternatively the metallic pillar is made of a metal, the principal component of which is at least one of copper, nickel, tungsten and molybdenum.

4. A pillar-shaped fired body as set forth in claim 1, wherein the pillar-shaped insulating base body is made of ceramic or silicon.

5. A pillar-shaped fired body as set forth in claim 1, wherein said pillar-shaped insert body is a hollow tube body arranged inside the insulating base body in parallel with the axis thereof, together with the metallic wirings, wherein the melting point of the hollow tube body is higher than the melting point, pour point or softening point of the insulating base body.

6. A pillar-shaped fired body as set forth in claim 1, wherein the insulating base body has a through hole extending in parallel with the axis thereof.

7. A pillar-shaped fired body as set forth in claim 1, wherein the metallic wiring is made of copper nickel, iron, silver or gold, or alternatively the metallic wiring is made of metal, the principal component of which is at least one of copper, nickel, iron, silver and gold.

8. A pillar-shaped fired body as set forth in claim 1, wherein a shape of the pillar-shaped fired body is a columnar or square.

9. A pillar-shaped fired body as set forth in claim 1, wherein the principal component of the pillar-shaped insulating base body is crystallized glass or amorphous glass.

10. A substrate formed into a sheet-shape, on the surface of which the metallic wiring is exposed when said fired body according to claim 1 is cut in a direction perpendicular to the axis by a predetermined thickness.

* * * * *